(12) United States Patent
Bastholm

(10) Patent No.: US 9,282,627 B2
(45) Date of Patent: Mar. 8, 2016

(54) LINEAR ACTUATOR SYSTEM WITH MEANS FOR FIRE DETECTION

(75) Inventor: Jeppe Christian Bastholm, Sønderborg (DK)

(73) Assignee: Linak A/S, Nordborg (DK)

(*) Notice: Subject to any disclaimer, the term of this patent is extended or adjusted under 35 U.S.C. 154(b) by 274 days.

(21) Appl. No.: 14/122,787

(22) PCT Filed: May 25, 2012

(86) PCT No.: PCT/DK2012/000061
§ 371 (c)(1),
(2), (4) Date: Nov. 27, 2013

(87) PCT Pub. No.: WO2012/163353
PCT Pub. Date: Dec. 6, 2012

(65) Prior Publication Data
US 2014/0077742 A1   Mar. 20, 2014

(30) Foreign Application Priority Data

May 27, 2011   (DK) ................................. 2011 00405

(51) Int. Cl.
*H05K 1/02* (2006.01)

(52) U.S. Cl.
CPC .............. *H05K 1/02* (2013.01); *H05K 1/0254* (2013.01)

(58) Field of Classification Search
USPC ......................................................... 318/490
See application file for complete search history.

(56) References Cited

U.S. PATENT DOCUMENTS

| 4,567,428 A | 1/1986 | Zbinden |
| 5,202,640 A | 4/1993 | Schaaf et al. |
| 7,066,041 B2 | 6/2006 | Nielsen |
| 7,109,722 B2 | 9/2006 | Chamberlin et al. |
| 7,129,710 B2 | 10/2006 | Bager |
| 8,555,431 B2 | 10/2013 | Nielsen |
| 2010/0002744 A1* | 1/2010 | Sheahan ............... G01K 7/16 374/1 |
| 2011/0057596 A1* | 3/2011 | Kagoshima ........ B60L 3/0061 318/490 |

FOREIGN PATENT DOCUMENTS

| GB | 2314699 | 1/1998 |
| WO | 2010109308 | 9/2010 |

* cited by examiner

*Primary Examiner* — Kawing Chan
(74) *Attorney, Agent, or Firm* — Dykema Gossett PLLC

(57) ABSTRACT

A linear actuator system comprising at least one linear actuator, a power supply, a control and an operation device. The linear actuator system comprises at least one printed circuit board having multiple layers comprising an electrically conductive circuit. At least one of the layers of the printed circuit board is designed as a detection layer for detecting a leakage current in the electrical circuit, including the electronic components mounted on the printed circuit board. An output voltage is applied to the detection layer, said voltage falling outside of the voltage range in which the electrical circuit works.

11 Claims, 3 Drawing Sheets

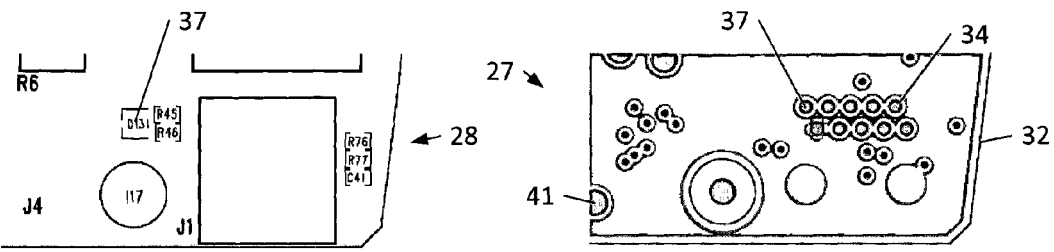
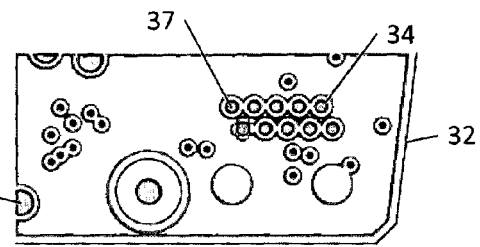
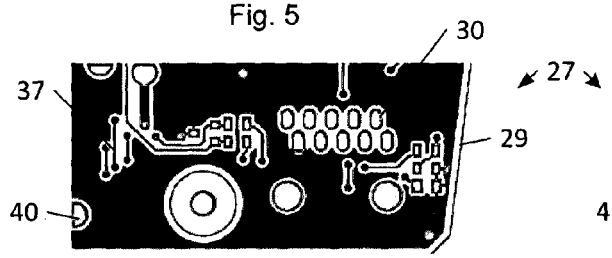
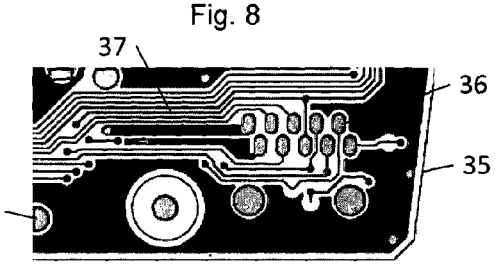
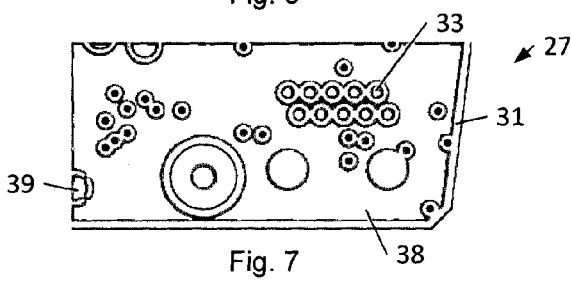
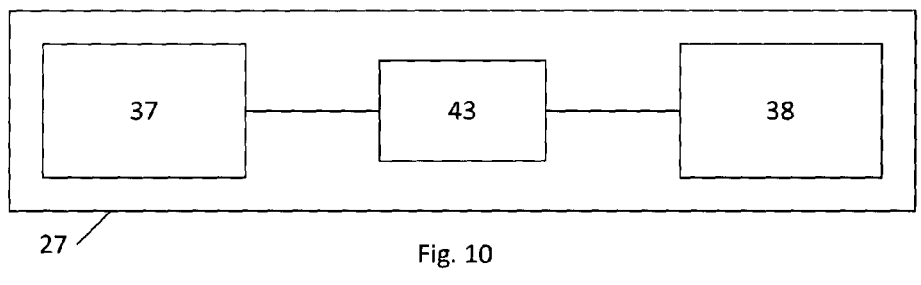
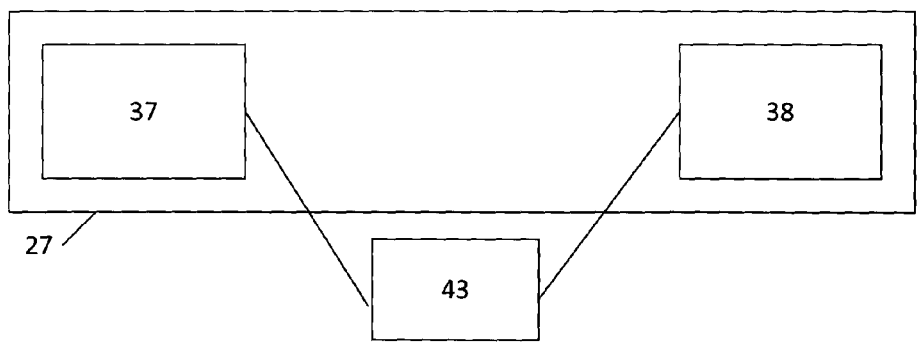

LINEAR ACTUATOR SYSTEM WITH MEANS FOR FIRE DETECTION

BACKGROUND OF THE INVENTION

Field Of The Invention

The invention relates to a linear actuator system.

The Prior Art

Electromechanical linear actuator systems are widely used within the hospital and care sector, mainly in connection with adjustable beds and chairs, where they are used for adjusting e.g. the back rest and leg rest section. Within this sector linear actuator systems are also used in patient lifts of the crane type having a bracket arm for raising and lowering a patient out of and into a chair or a bed. Furthermore, linear actuator systems are used in other connections like e.g. solar plants supply networks.

Normally, a type of linear actuator comprising a thrust rod is used, e.g. of the type described in WO 02/29284 A1 Linak A/S. This type of linear actuator comprises a spindle with a spindle nut. The spindle is driven by a reversible electric motor through a transmission. When the spindle is driven the spindle nut is moved in an inwards or outwards direction depending on the direction of rotation of the electric motor. The linear actuator is an independent product, where spindle, transmission and electric motor are incased in a housing. The housing typically consists of a motor housing and an outer tube. An inner tube is secured to the spindle nut. The inner tube is displaced in and out of the outer tube as the spindle nut is moved in and out on the spindle. At the opposite end of the spindle nut the inner tube is equipped with a front mounting. The outer side of the motor is equipped with a rear mounting. The front mounting and rear mounting are used for securing the linear actuator to the structure which should be adjusted.

An aspect concerning all of these applications is the fire hazard in one or more parts of the actuator system. It is known that particularly errors or defects of the electrical circuits and electronic components can cause fires. The source can e.g. be a defect of an electronic component or a manufacturing fault in the laying out of the conducting circuit on a printed circuit board. Here the continuous supply of electricity to the defective and faulty area will cause heating in and around the component and/or the conducting circuit of the printed circuit board. The heat and the continuous supply of electricity constitute a latent fire hazard. It is not given that a fire will develop immediately in the defective and faulty area, but the hazard will increase over time. This can be due to the condition of the defect or just owing to the fact that the electrical circuit is not constantly connected but rather for short periods at a time. In terms of the construction it is common to counter this risk by using fire retardants in both the printed circuit boards and the housing parts typically surrounding the printed circuit boards. These fire retardants are however not activated until the fire develops often resulting in smoke and soot damages. Moreover, the fire retardants are often limited to preventing fire in the part/parts in which they are integrated. Therefore, it is not certain that the fire retardants are able to prevent a developing fire.

For other purposes it is known to use smoke detectors for detecting heat and/or smoke formation, which can indicate that a fire is potentially developing or has already developed. There are various principles on which a smoke detector can be based, among these optical, ionization and air-sampling. Although all of these detection types in principle can be integrated in one or more parts of a linear actuator system this is only possible with a significant undesirable increase in the size of the linear actuator. Furthermore, these types of detections are very cost-intensive and are thus not attractive in their present form.

U.S. Pat. No. 7,109,722 B2 to International Business Machines Corporation describes an apparatus and method for detecting and preventing smoke and fire occurrences in a printed circuit board having an electrical circuit. Here the printed circuit board has a detection plane, comprising a sensing element consisting of at least two separate tracks or comb-shaped arrays. A positive voltage will generally be applied to one track while the other track will be earthed and the leakage current there between is measured. However, the comb-shaped array is time consuming and the laying out and manufacturing of the printed circuit board is cost-intensive. Further, a great risk exists that undesired conductive connections between the comb-shaped array and the electrical circuit in the printed circuit board will occur.

The invention relates to the problem of achieving a linear actuator system which at an early stage is capable of detecting a developed fire or providing information that a fire potentially may arise or has already developed such that fire preventive or fighting measures may be initiated.

The purpose of the invention is thus to provide a linear actuator system which in a safe, simple and economically manageable manner solves the problem of fire detection and fire fighting in a linear actuator system.

SUMMARY OF THE INVENTION

This is according to the invention achieved in that the linear actuator system comprises at least one printed circuit board having multiple layers which comprises at least one electrically conductive circuit and where at least one of the layers of the printed circuit board is an electrically conductive detection layer for detecting a leakage current and where a voltage falling outside the working range of the electrically conductive circuit is applied to the detection layer. By applying a voltage which falls outside the working range of the electrically conductive circuit a leakage current can be detected regardless of how small it might be. This is owing to the fact that a leakage current will always differ from the voltage applied to the detection layer. In case a leakage current is detected measures may be taken which can prevent the leakage current from developing into e.g. a fire in the linear actuator system. It is thus possible to solve the above problem concerning early detection of a fire. The measures which may be taken based on the measured leakage current can e.g. be interruption of the mains voltage to the printed circuit board or giving off an auditory or visual signal to the user or relevant staff. A side benefit to this solution is that a leakage current can indicate whether a linear actuator risks failing. Thus unintended occurrences may be anticipated before they occur. An unintended occurrence could e.g. involve the linear actuator not preforming the desired function or that a movement of the linear actuator is interrupted. Such an occurrence could endanger a patient. To accommodate such an occurrence the information concerning a detected leakage current can be transferred to the operation device of the linear actuator system or be indicated on a service monitor connected to the system. The information could also be sent to a service center which based on this information can send a technician to check on the linear actuator system.

In an embodiment the detection layer is a continuous electrically conductive layer. In yet another embodiment the detection layer has an area approximately corresponding to the area of the printed circuit board. Thus a leakage current can be detected regardless of where on the printed circuit board it may occur.

In an embodiment the detection layer in the linear actuator system is connected to a detector which detects a leakage current. The detector can be located on the printed circuit board in which the detection layer is located. The detector may also be separate from the printed circuit board in which the detection layer is located.

In an embodiment of the linear actuator system the detector is a transistor which can detect a static leakage current.

In another embodiment of the linear actuator system the detector is part of a capacitor for detecting a dynamic leakage current.

The present invention further relates to a method for fire detection in a linear actuator system which includes at least one printed circuit board having multiple layers comprising at least one electrically conductive circuit and where at least one on the layers of the printed circuit board is a detection layer for detecting a leakage current by applying a voltage falling outside of the working range of the electrically conductive circuit to the detection layer.

An embodiment of the linear actuator system according to the invention will be described more fully below with reference to the accompanying drawings.

BRIEF DESCRIPTION OF THE DRAWINGS

FIGS. 5-9 show a schematic view seen from above of each layer of a printed circuit board having four layers from a linear actuator system where FIG. 5 shows the outline of the mounted components, FIGS. 10 and 11 show how the detector is connected to the electrical circuit on the printed circuit board shown in FIGS. 5-9.

DETAILED DESCRIPTION OF THE DEPICTED EMBODIMENTS

Figure 1:
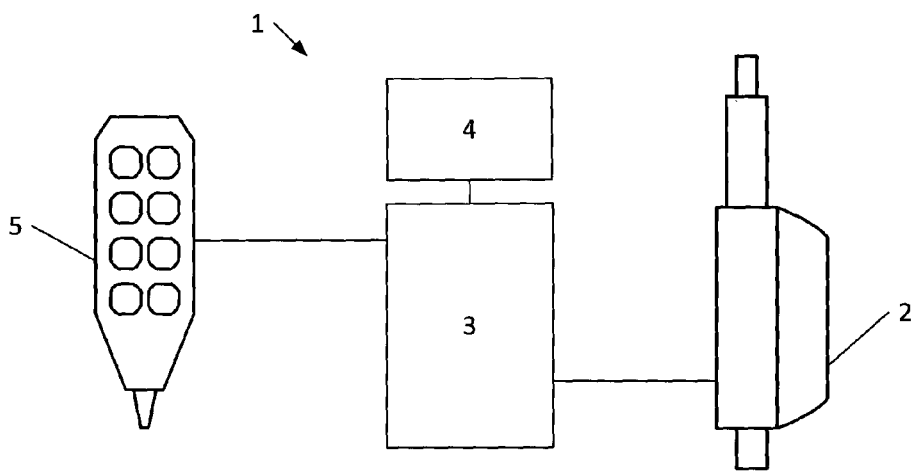
FIG. 1 shows an actuator system and its sub-components according to the invention.

FIG. 1 shows a linear actuator system 1 comprising a linear actuator 2, a control box 3, a power supply 4 and a hand control 5. The linear actuator system further comprises a control device (not shown). The control device is generally placed in the control box 3 but may also be placed in the hand control 5 or the linear actuator 2.

Figure 2:
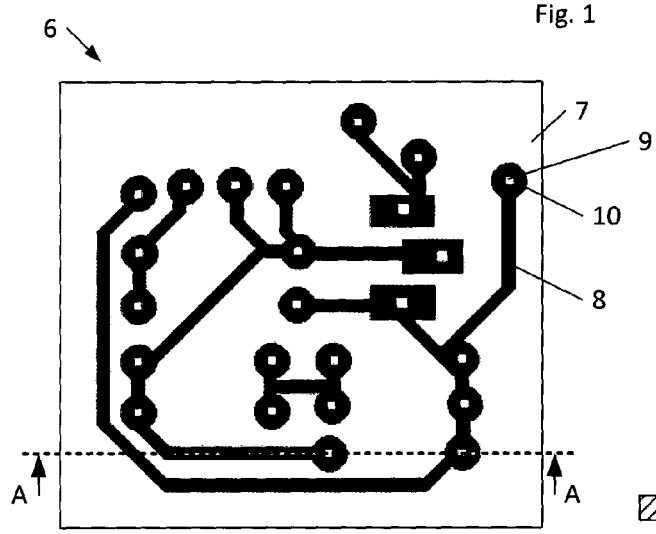
FIGS. 2-3 show a section of a printed circuit board and a cross section thereof.
Figure 3:
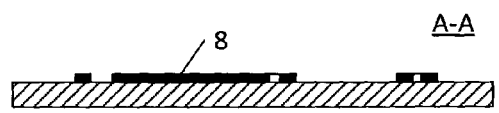
Figure 4:
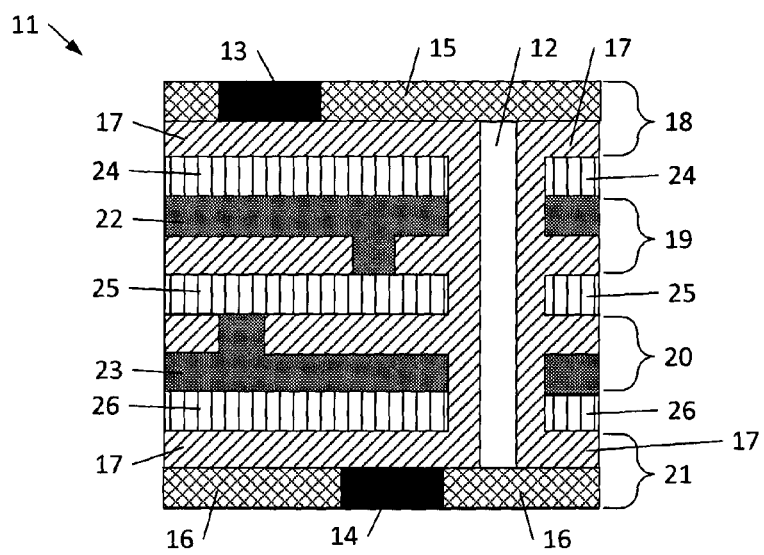
FIG. 4 shows a cross section of a selected area of a random printed circuit board having four layers.

FIG. 2 shows a schematic section of a printed circuit board 6 seen from above. FIG. 3 shows the section A-A shown in FIG. 2. A printed circuit board (printplade) is also known as a printed circuit board (printkort). The shown printed circuit board 6 comprises a plate made from an electrically insulating material 7 where the surface is furnished with tracks 8 of electrically conductive foil, e.g. copper. The laid out tracks 8 thus constitute a printed circuit. The plate of an electrically insulating material 7 or non-conducting material can e.g. be made from polymers, glass/epoxy laminates or ceramic materials. The printed circuit functions as electrical connections which connects a number of electronic components which can be mounted on one side or both sides of the plate thus establishing the desired electrical circuit. Previously all components were mounted in through-going holes 9 in the printed circuit board and subsequently soldered to electrically conductive solder points 10, where the through-going hole 9 was located. The solder points 10 were connected directly to the printed circuit. Nowadays most components are mounted on the surface of the printed circuit board. These surface-mounted components are also known as Surface Mount Devices, in short SMD and the technology behind is known as Surface Mount Technology, in short SMT. The SMD components are soldered directly onto copper-coated, or other electrically conductive surfaces on the printed circuit board.

As the SMD components have gained currency, printed circuit boards consisting of many layers are now commonly used. Here, the printed circuit boards are generally built as a sandwich structure comprising in turn an insulating layer and a conductive circuit. Connections between the circuits of the different layers can be created with a conductive channel, a so-called via. The insulating layer is thus not extended into the area with the via. Alternatively, an insulating middle layer with a via may be used thus achieving the desired connections. FIG. 3 shows a cross section of a selected area on a random printed circuit board 11 having four layers, which in this cross section also comprises a via 12. The printed circuit board 11 has a mounting area 13,14 on the upper and lower side, respectively onto which a SMD component may be soldered. The mounting areas are surrounded by an anti-soldering material 15,16 rendering adherence of the soldering material on the mounting areas 13,14 impossible. The two mounting areas 13,14 are interconnected through the electrically conductive foil 17, which through the via 12 connects the four layers 18,19,20,21. It is noted that the conductive connection between the four layers 18,19,20,21 through the via 12 does not form an electrical connection between the four layers 18,19,20,21 in their entire horizontal extent. Thus, the layers 19,20 comprise a covering layer 22,23, constituted by a nonconductive material. Each of the four layers 18,19,20,21 of the printed circuit board is separated by an electrically insulating layer 24,25,26. It should however be understood that the insulating layer can be penetrated by one or more vias 12 between two or more of the layers 18,19,20,21 of the printed circuit board.

FIGS. 6-9 show a schematic section seen from above of each layer of a printed circuit board 27 having four layers of a linear actuator system of the type shown in FIG. 1. FIG. 5 is a schematic illustration showing the outline of the components 28, which should be mounted on the printed circuit board 27. These components are mounted on the topmost layer 29 (FIG. 6) of the printed circuit board with a soldering on the respective mounting areas e.g. the mounting area 30. This mounting area 30 further constitutes the beginning of the via, which is conducted through the layers 31,32 through the areas 33,34 and then finally terminating in the lowermost layer in the area 36. The layers 29,32,35 constitute the electrical circuit 37 including the electronic components schematically illustrated in FIG. 5 of the printed circuit board 27. The layer 31 comprises a detection layer 38 isolated from the electrical circuit 37. It is e.g. noted that there is no direct connection between the area 33, which is part of the previously mentioned via (constituted by the areas 30,33,34,36) and the detection layer 38. It is thus only the input connection 39 which establishes connection to the detection layer 38. The input connection 39 is here designed as a via in connection with the areas 40,41,42 in the layers 29,32,35, respectively. It is however noted that the areas 40,41,42 are isolated from the electrical circuit 37 in their respective layers. The detection layer 38 in the layer 31 (FIG. 7) are used for detecting a leakage current in the circuit 37 including the mounted components of the printed circuit board. Through the input connection 39 an output voltage is applied to the detection layer 38 and connected to a detector 43 (FIGS. 10 and 11) for detecting possible changes to this output voltage, which thus can indicate an emerged leakage current. The applied output voltage falls outside the working range 47 of the electrical circuit (see FIG. 13). The detection layer 38 is continuous and has an area approximately corresponding to the area of the printed circuit board 27. It is however noted that the area of the detection layer does not exceed the area of the printed circuit board.

Figure 12:
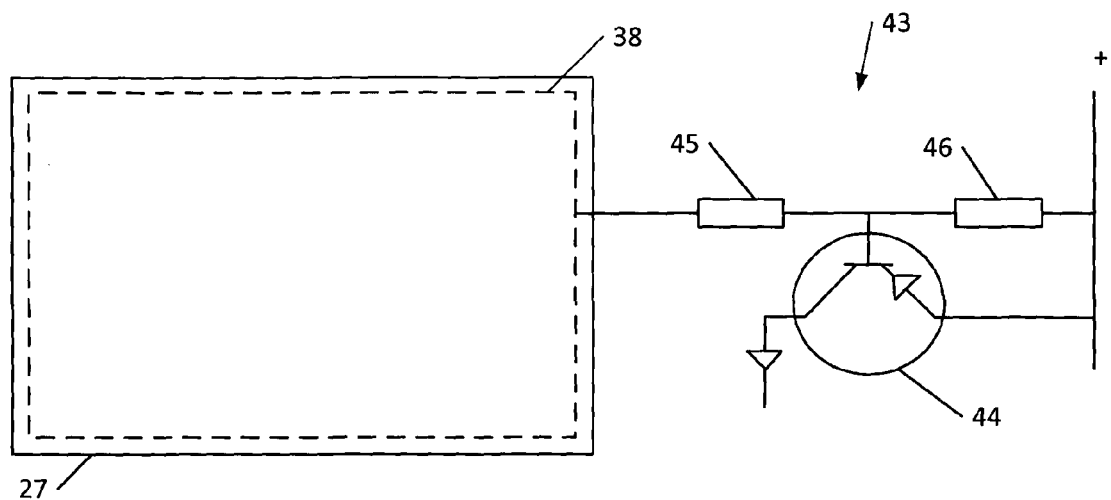
FIG. 12 shows a diagram of an embodiment of the detector.

A developed leakage current in an actuator system 1 can typically be caused by a defect in the actual printed circuit board 27 and/or the electrical circuit 38 including one or more of the mounted components. Due to the continuous supply of electricity energy will accumulate in and around the defect. The increased energy accumulation will cause a rise in the temperature in and around the defect which again will contribute to increasing the strength of the leakage current between the detection area 38 and the defective area in the electrical circuit 37. This is primarily owing to the fact that the growing energy accumulation in and around the defective area causes a heat development in that same area. The energy accumulation can potentially cause a fire in and around the defective area. This is of course an undesired situation which when not stopped can have very serious consequences. The detection layer 38 is connected to the detector 43 for registering the leakage current. As the output voltage applied to the detection layer falls outside of the working range of the electrical circuit the detector 43 will be able to detect even very small leakage currents. This is owing to the fact that the leakage current has a voltage falling within the working range 47 of the electrical circuit 37 which is thus different from the applied output voltage on the detection layer 38. If the working range 47 of the electrical circuit 37 e.g. is in the interval 0-40V (Volt) an output voltage of e.g. 50V or –10V can be applied to the detection layer. The detector 43 may further be connected to the circuit 47 including the mounted components of the printed circuit board, which based on a signal from the detector 43 can interrupt the current to the electrical circuit 37 of the printed circuit board or part of the electrical circuit. In an embodiment that signal concerning the occurred leakage current can be transmitted to the hand control 5 of the actuator system (see FIG. 1), which thus be able to signal the user or relevant staff. In another embodiment the signal can be transmitted to a service indicator which already monitors other service requiring elements of the linear actuator system. In yet another embodiment the signal can be transmitted to a surveillance unit which can send a technician to inspect the actuator system at hand. This can be achieved in that the actuator system is connected to a communications platform such as a data bus or a junction box which can provide the user, relevant staff or other units with information concerning the occurred leakage current. In yet another embodiment the detector 43 can be configured such that information concerning the leakage current is not transmitted until it exceeds a predefined threshold and/or if the leakage current has been ongoing for a predefined period. The detector 43 can be a transistor e.g. a bipolar transistor used for detecting a static leakage current i.e. a direct current. An example of this embodiment is shown in FIG. 12. In another embodiment the detection layer 38 can constitute a part of a capacitor used for detecting a dynamic leakage current i.e. an alternating current.

FIG. 10 shows an outline of how the electrical circuit 37 on the printed circuit board 27 in FIGS. 5-9 is connected to the detection layer 38 through the detector 43. It is noted that the detector in this embodiment is located on the printed circuit board 27.

FIG. 11 shows an outline of how the electrical circuit on the printed circuit board 27 in FIGS. 5-9 is connected to the detection layer 38 through the detector 43. Here, it is noted that the detector in not located on the printed circuit board 27.

FIG. 12 shows a schematic diagram of an embodiment of the detector 43 connected to the detection layer 38 on the printed circuit board 27. In this embodiment the detector 43 consists of a transistor 44 located in connection with two serially connected resistances 45,46. The detector is capable of measuring if a leakage current occurs and generate an output signal if the leakage current exceeds a given threshold value.

Figure 13:
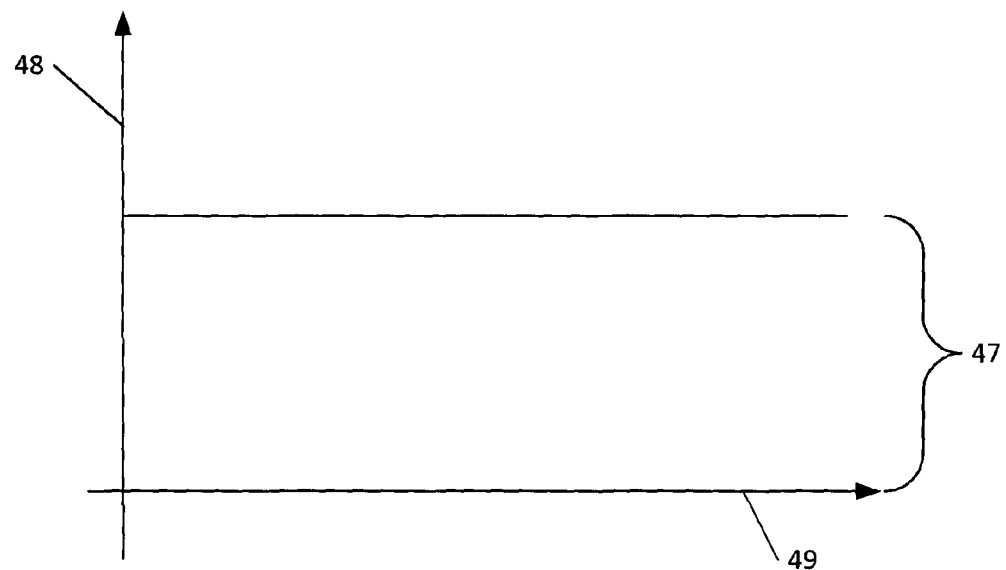
FIG. 13 shows a working range of the electrical circuit on a printed circuit board.

FIG. 13 shows in a two-dimensional system of co-ordinates the working range 47 here illustrated by a voltage (ordinate axis) in which the electrical circuit 37 on the printed circuit board 27 works over time (axis of abscissa). The voltage applied to the detection layer 38 falls outside of this working range 47.

It is noted that the invention may likewise be used in actuator systems comprising so-called dual actuators having two spindle units in one mutual housing. This type is described more fully WO 2007/093181 A1 Linak A/S.

The invention claimed is:
1. A linear actuator system comprising
a control,
a power supply,
a linear actuator,
an operating device, and
at least one printed circuit board having multiple layers comprising at least one electrically-conductive circuit and wherein at least one of the layers of the printed circuit board is a detection layer for detecting a leakage current and wherein a voltage which falls outside of a working range of the electrically-conductive circuit is applied to the detection layer.
2. The linear actuator system according to claim 1, wherein the detection layer comprises a continuous electrically-conductive layer.
3. The linear actuator system according to claim 1, wherein an area of the detection layer approximately corresponds to an area of the printed circuit board.
4. The linear actuator system according to claim 1, wherein the detection layer is connected to a detector for detecting a leakage current.
5. The linear actuator system according to claim 1, wherein the electrically-conductive circuit of the printed circuit board is connected to the detection layer through the detector.
6. The linear actuator system according to claim 1, wherein the detector is located on the printed circuit board.
7. The linear actuator system according to claim 1, wherein the detector is located separate from the printed circuit board.
8. The linear actuator system according to claim 1, wherein the detector comprises a transistor for detecting a static leakage current.
9. The linear actuator system according to claim 1, wherein the detector comprises a part of a capacitor for detecting a dynamic leakage current.
10. The linear actuator system according to claim 1, comprising a control box containing the control.

11. A method for fire detection in a linear actuator system comprising
 a control,
 a power supply,
 a linear actuator,
 an operating device, and
at least one printed circuit board having multiple layers comprising at least one electrically conductive circuit and wherein at least one of the layers of the printed circuit board is a detection layer for detecting a leakage current, the method comprising applying a voltage which falls outside of a working range of the electrically-conductive circuit to the detection layer.

* * * * *